(12) United States Patent
Andryushchenko et al.

(10) Patent No.: US 7,585,760 B2
(45) Date of Patent: Sep. 8, 2009

(54) METHOD FOR FORMING PLANARIZING COPPER IN A LOW-K DIELECTRIC

(75) Inventors: Tatyana N. Andryushchenko, Portland, OR (US); Anne E. Miller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 434 days.

(21) Appl. No.: 11/473,738

(22) Filed: Jun. 23, 2006

(65) Prior Publication Data

US 2007/0298605 A1 Dec. 27, 2007

(51) Int. Cl.
*H01L 21/4763* (2006.01)
(52) U.S. Cl. ............... 438/626; 257/752; 257/E23.145
(58) Field of Classification Search ................ 438/626; 257/752, E23.145
See application file for complete search history.

(56) References Cited

U.S. PATENT DOCUMENTS

| 5,096,550 | A | 3/1992 | Mayer et al. | |
|---|---|---|---|---|
| 5,256,565 | A | * 10/1993 | Bernhardt et al. | ............ 438/631 |
| 6,600,229 | B2 | * 7/2003 | Mukherjee et al. | .......... 257/762 |
| 6,790,336 | B2 | 9/2004 | Andryushchenko | |
| 2004/0253809 | A1 | * 12/2004 | Yao et al. | ..................... 438/631 |
| 2005/0003637 | A1 | 1/2005 | Andryushchenko et al. | |
| 2005/0146034 | A1 | 7/2005 | Andryushchenko et al. | |
| 2005/0250312 | A1 | * 11/2005 | Hu et al. | ..................... 438/624 |
| 2006/0276030 | A1 | * 12/2006 | Wang et al. | ................. 438/631 |

* cited by examiner

*Primary Examiner*—Asok K Sarkar
*Assistant Examiner*—Julia Slutsker
(74) *Attorney, Agent, or Firm*—Blakely, Sokoloff, Taylor & Zafman LLP

(57) ABSTRACT

Methods of fabricating an interconnect, which fundamentally comprises forming a second conductive film (e.g., aluminum) over first conductive film (e.g., copper) deposited in an opening formed in a dielectric layer (e.g., low-k dielectric). The second conductive film has an ability to reflow to form a planar surface upon a thermal treatment process. Electropolishing is then used to planarize the second and first conductive films, wherein an electrolyte solution selective to remove the first conductive film faster than the second conductive film is used. An interconnect is formed.

20 Claims, 8 Drawing Sheets

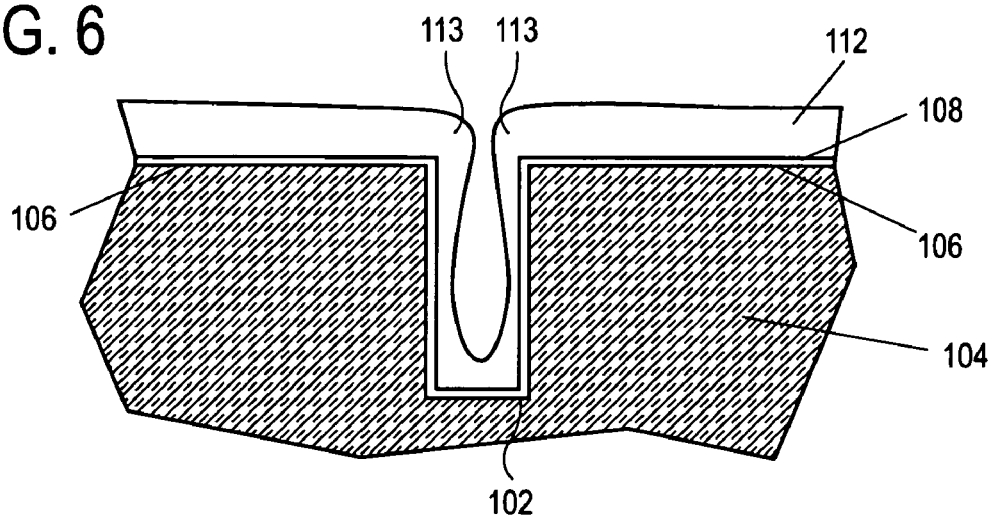
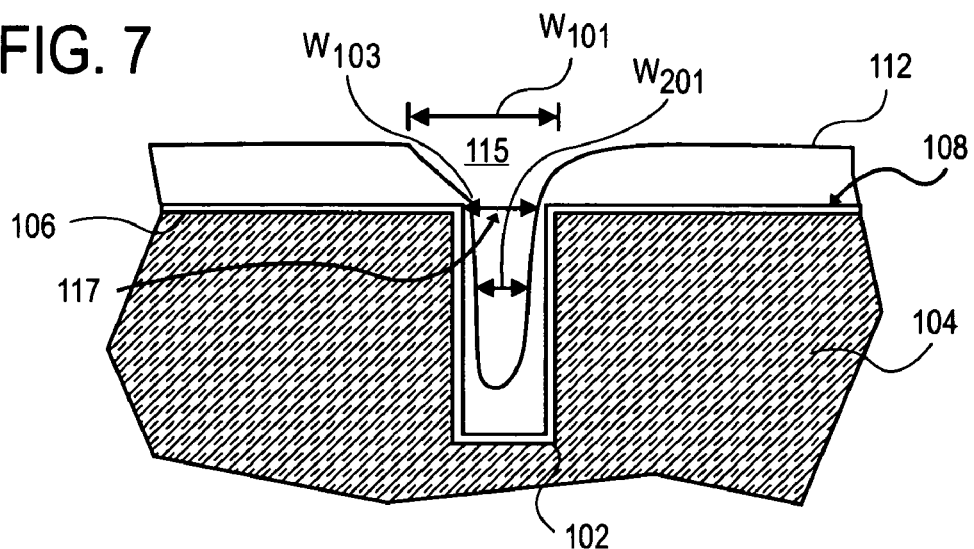
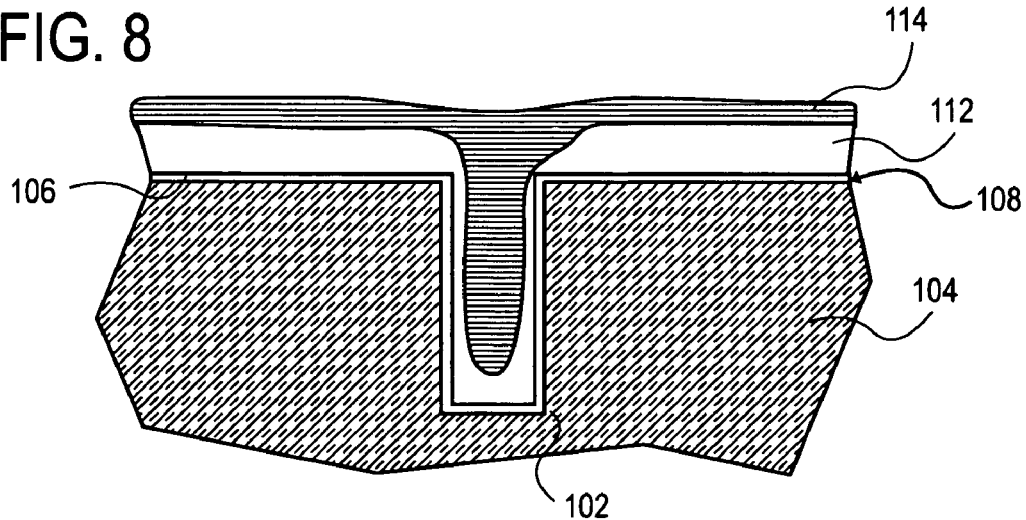

FIG. 11B
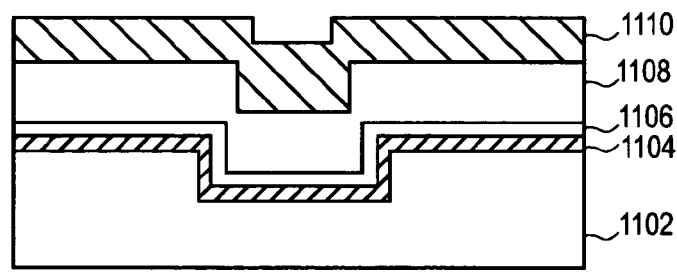
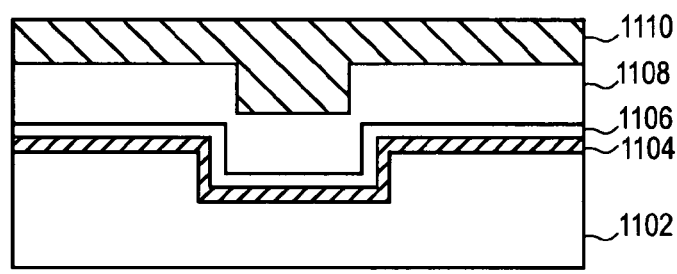
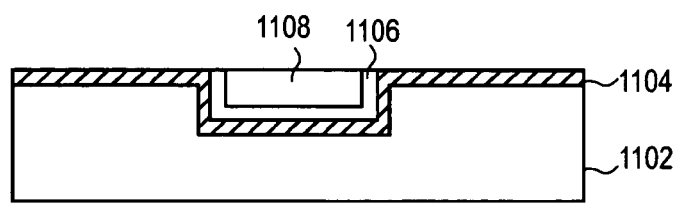
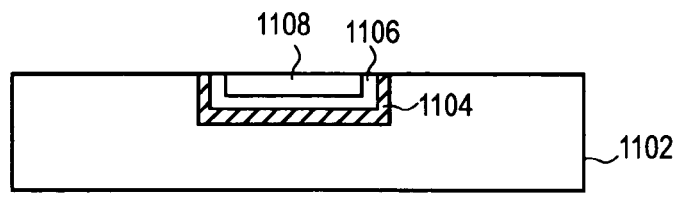

METHOD FOR FORMING PLANARIZING COPPER IN A LOW-K DIELECTRIC

BACKGROUND

1. Field

Embodiments of the present invention relate to the fabrication of interconnect structures in microelectronic devices. In particular, embodiments of the present invention relate to a method for copper deposition to fill narrow and high aspect ratio openings formed in low-k dielectric layers during the fabrication of interconnect structures.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects".

One process used to form interconnects is known as a "damascene process". In a typical damascene process, a photoresist material is patterned on a dielectric material and the dielectric material is etched through the photoresist material patterning to form a hole or a trench or a via (hereinafter collectively referred to as "an opening" or "openings"). The photoresist material is then removed (typically by an oxygen plasma) and the opening is then filled with a conductive material (e.g., such as a metal or metal alloys). The filling of the opening may be accomplished by either physical vapor deposition, chemical vapor deposition, or electroplating, as will be understood to those skilled in the art. The term "interconnect" is defined herein to include all interconnection components including trenches and vias filled with conductive material.

A barrier layer is typically deposited on the dielectric material within the opening to prevent diffusion of the conductive material. For example, as known, copper is one preferred conductive material. Copper diffuses quickly and easily into adjacent layer, thus, a diffusion layer is needed to prevent such diffusion. Additionally, a seed layer is deposited on the barrier layer. The seed layer acts as an activation site for a conductive material to form thereon.

The resulting structure is planarized, usually by a technique called chemical mechanical polish (CMP) or by an etching process, which removes the conductive material, which is not within the opening, from the surface of the dielectric material, to form the interconnect. As is understood by those skilled in the art, a variety of vias and trenches may be formed in the various dielectric material layers to electrically connect to one another and/or to various electronic components. In another damascene process, known as a "dual damascene process", trenches and vias are substantially simultaneously filled with the conductive material with a single deposition.

As the density of integrated circuits within microelectronic devices continues to increase with each successive technology generation, the interconnects become smaller and their aspect ratios (i.e., the ratio of depth to width) may increase. As shown in FIGS. 1-2, a problem with small size and/or high aspect ratios is that a conductive material 402 can build up at an opening 404 proximate a first surface 406 of a dielectric material 408 (i.e., the "mouth" 412 of the opening 404) during deposition. A barrier layer 410 is also present, as will be understood to those skilled in the art.

The "build-up" or "overhang" (illustrated within dashed circle 414) blocks the path of the conductive material 402 deposition and, as shown in FIG. 3, often can result in voids 416 forming within the conductive material 402 in the opening 404 (shown in FIGS. 1-2). Typically, copper is used for filling the opening 404 and a seed layer (not labeled) is often formed over the barrier layer 410 prior to the deposition of the copper to form the interconnect. Also, for such a small opening, the barrier layer 410 and the seed layer need to be formed conformally to facilitate uniform deposition of the copper filling. Current methods of forming the seed layer tends to result in insufficient sidewall coverage or non-continuous seed layer that also produces voids 416 during opening filling process. Increasing the seed layer thickness also results in the overhang 414.

FIG. 3 illustrates an interconnect 418 is formed after the conductive material 402 is deposited and planarized. The voids 416 can have different sizes, distributions, and locations within the interconnect 418. For example, some voids 416 may be so large that they effectively break the conductive path of the interconnect 418, which may result in the failure of the microelectronic device, thereby having an immediate impact on yield. Additionally, the voids 416 may also be small, which may have an immediate impact by restricting the flow of electrons along the interconnect 418 and/or may have a negative impact on the long-term reliability of the microelectronic device.

Current technology attempts to deal with the void and overhang problem by modifying the seed layer deposition process. For example, after depositing the seed layer, the seed material is re-flown (by using a thermal treatment process that causes the material to re-flow and reform) to improve conformality of the seed layer. Other process includes multiple flash deposition steps or increasing a plasma power used in depositing the seed layer.

Additionally, as mentioned, CMP is used for planarizing the deposited copper material. However, for a low-k dielectric, the mechanical integrity of the dielectric layer may be weakened by the process. Thus, the conventional process used to planarize the conductive material has a high tendency of damaging the dielectric layer.

It remains that there is no solution for uniformly filling the small features such as high aspect ratio trenches or vias typically referred to as features of 32 nm technology node. There also remains no solution for a planarizing method that minimizes damages to the dielectric layer.

Therefore, it would be advantageous to develop techniques to effectively fill openings, while reducing or substantially eliminating void formation during the fabrication of interconnects for microelectronic devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 6 illustrates a side cross-sectional view of a seed layer abutting the barrier material of FIG. 5, according to a conventional method with an overhang;

FIG. 7 illustrates a side cross-sectional view of a seed layer abutting the barrier material of FIG. 6, according to an embodiment of the present invention with the overhang etched back;

FIG. 8 illustrates a side cross-sectional view of the opening of FIG. 7 filled with a conductive material by an electroplating process;

FIG. 11A-11B compares some distinction between a conventional Chemical Mechanical Process to planarize the conductive material and embodiments of the present invention using a reflow treatment of aluminum in conjunction with electropolishing to planarize the conductive material.

DETAILED DESCRIPTION OF THE ILLUSTRATED EMBODIMENT

Figure 1:
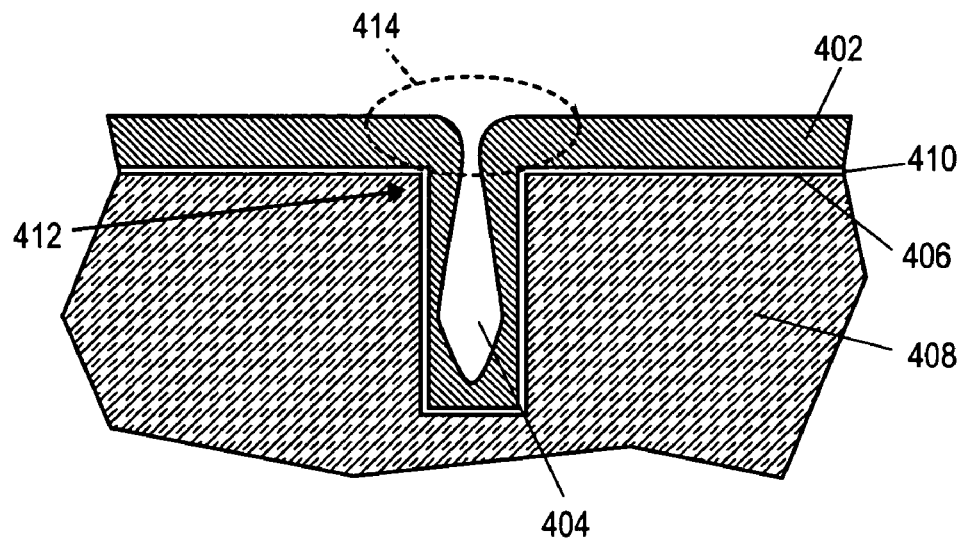
FIG. 1 illustrates a side cross-sectional view of a high aspect ratio opening having a build-up of conductive material at the mouth of an opening in a dielectric material during deposition of the conductive material, as known in the art.
Figure 2:
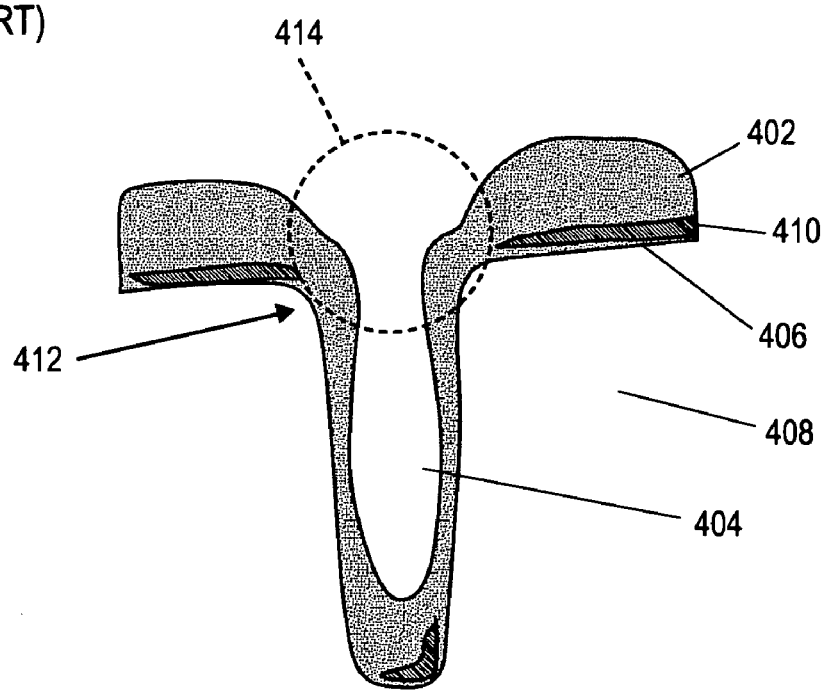
FIG. 2 is a micrograph showing the build-up of conductive material as illustrated in FIG. 1, as known in the art.
Figure 3:
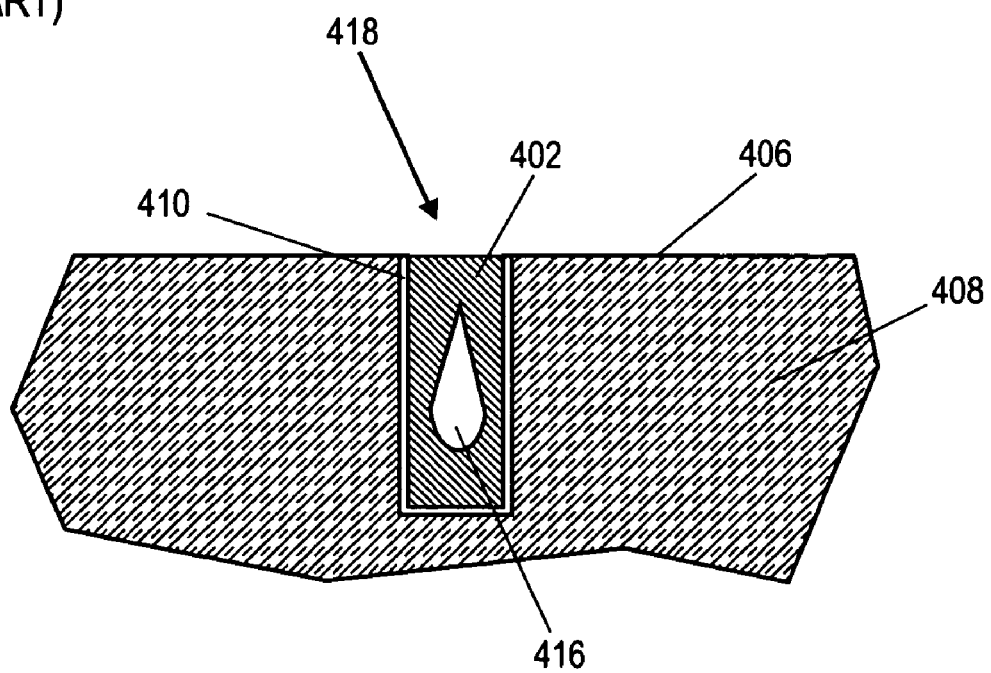
FIG. 3 illustrates a side cross-sectional view of a void within an interconnect, as known in the art.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of interconnect structures in microelectronic devices. The interconnect structures are fabricated by forming at least one opening in (e.g., a trench or via) a dielectric material and filling the opening(s) utilizing a deposition technique such as electroplating or electroless plating.

Figure 4:
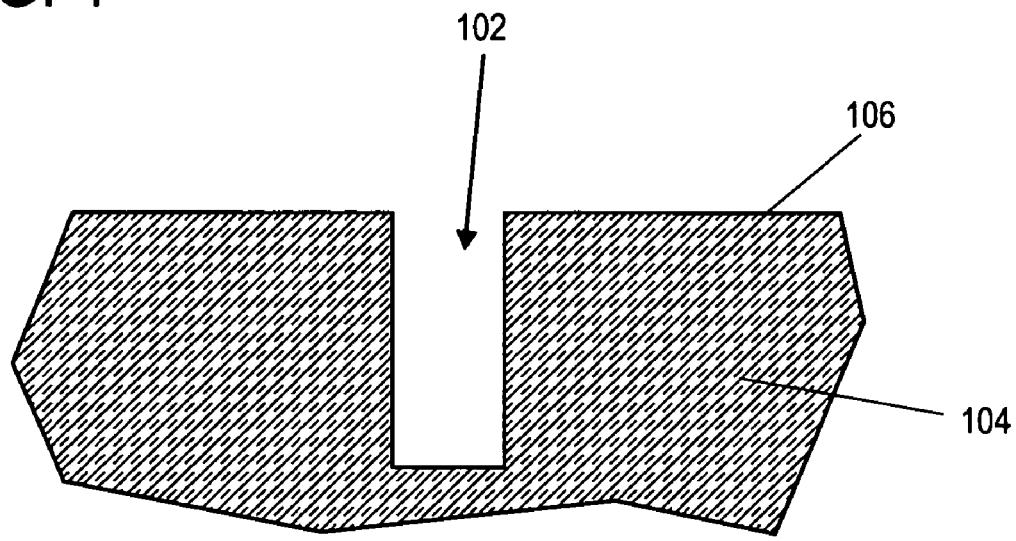
FIG. 4 illustrates a side cross-sectional view of an opening formed in a dielectric material, according to the present invention.
Figure 5:
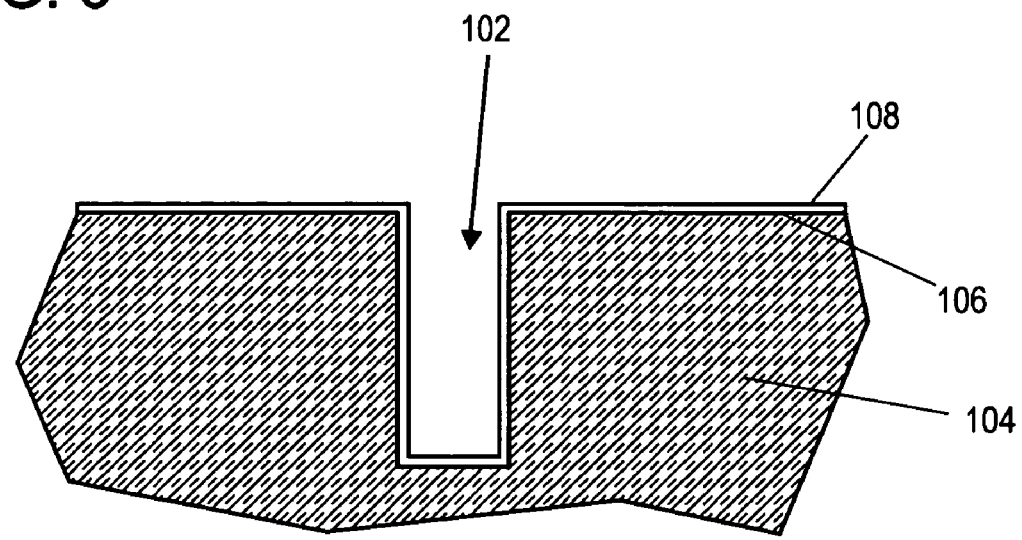
FIG. 5 illustrates a side cross-sectional view of an ultra-thin barrier material lining the opening of FIG. 1, according to the present invention.

In one embodiment of the present invention as shown in FIG. 4, an opening 102 is formed in a dielectric material layer 104, extending into the dielectric material layer 104 from a first surface 106 thereof. The dielectric material layer 104 may include, but is not limited to, silicon oxide, silicon nitride, carbon doped oxide, fluorinated silicon oxide, boron/phosphorous doped oxide, and the like. In one embodiment, the dielectric material layer 104 is a low-k dielectric layer. The dielectric material layer 104 is typically formed on a substrate (not shown) that may comprise various features, components, micro devices, or layers formed therein or thereon as is known in the art. The opening 102 may be formed by any technique known in the art, including but not limited to, lithography, ion milling, laser ablation, and the like. As shown in the FIG. 5, a barrier material layer 108 is deposited in the opening 102 to substantially and conformally abut (on top of) the dielectric material layer 104. Such, barrier material layers 108 are used when a material which will be subsequently deposited in the opening 102 is susceptible to diffusion into the dielectric material layer 104, such as copper and copper alloys. Such diffusion can adversely affect the quality of microelectronic device through increased leakage current and/or decreased reliability between interconnects.

Referring to FIG. 4, the dielectric layer 104 is typically an interlayer dielectric, which may be any one of a plurality of known dielectric layers. Conductors are typically formed in the layer 104 which provide conductive paths with vias extending to conductors lying below the layer 104 and vias lying above the layer 104. For purposes of the description below, only the formation of a conductor is described within the layer 104 using a damascene process. It will be apparent that contacts to underlying structures are formed simultaneously with the formation of the conductors, as is well-known in the art. The processing described below is used to simultaneously form not only the conductors in the layer 104, but also the vias which contact structures below the layer 104.

The layer 104 may be formed from any one of a plurality of known dielectric materials. In one embodiment of the present invention, the layer 104 is formed from a low-k dielectric such as a polymer based dielectric. In another embodiment, an inorganic material such as a carbon-doped oxide is used.

One category of low k materials, the organic polymers, are typically spun-on. A discussion of perfluorocyclobutane (PFCB) organic polymers is found in "Integration of Perfluorocyclobutane (PFCB)", by C. B. Case, C. J. Case, A. Komblit, M. E. Mills, D. Castillo, R. Liu, Conference Proceedings, ULSI XII.COPYRGT. 1997, Materials Research Society, beginning at page 449. These polymers are available from companies such as Dupont, Allied Signal, Dow Chemical, Dow Coming, and others.

Another category of low-k materials that may be used in the present invention are silica-based such as the nanoporous silica aerogel and xerogel. These dielectrics are discussed in "Nanoporous Silica for Dielectric Constant Less than 2", by Ramos, Roderick, Maskara and Smith, Conference Proceedings ULSI XII.COPYRGT. 1997, Materials Research Society, beginning at page 455 and "Porous Xerogel Films as Ultra-Low Permittivity Dielectrics for ULSI Interconnect Applications", by Jin, List, Lee, Lee, Luttmer and Havermann, Conference Proceedings ULSI XII.COPYRGT. 1997, Materials Research Society, beginning at page 463.

The barrier layer 108 is thin and in one embodiment, generally less than 100 Å thick. In other embodiments, barrier layer 108 is less than 20 Å, less than 15 Å, and even less than 10 Å along the sidewalls of the opening 102 and optionally, along a surface 106 of that dielectric material layer 104. Physical vapor deposition (PVD), chemical vapor deposition (CVD) or other deposition method can be used to form the barrier layer 108.

A typical material can also be used for the barrier material layer 108, particularly for copper interconnects, may also include tantalum (Ta), tantalum nitride (TaN), tantalum silicon nitride (TaSiN), tantalum carbonate nitride (TaCN), tantalum carbonide (TaC), titanium (Ti), titanium nitride (TiN), titanium silicon nitride (TiSiN), tungsten (W), tungsten nitride (WN), tungsten carbonate nitride (WCN), etc., and nitrides, oxides, and alloys thereof. A portion of the barrier material layer 108 may also extend over and abut the dielectric material first surface 106. In many embodiments, an ultra-thin seed layer may be formed on top of the barrier layer 108.

A conductive seed material or layer 112 is deposited on the barrier layer 106. FIG. 6 shows an overhang portion 113 being formed as the seed material 112 is formed using current technologies, e.g., PVD, CVD, or ALD. As mentioned, the overhang 113 is a typical formation in forming the seed layer 112 to line an opening. For example, current technology deposit a copper seed layer with such overhang portion due to the non-conformality characteristic of the copper seed layer as it is being deposited. As can be seen, depositing copper (or other conductive material) to fill the opening 102 tends to lead to void formation. In one embodiment of the present invention, at least a portion of the seed material 112 (after deposited) is etched back or removed at a controlled rate, preferably at a slow etch rate, prior to filling the opening 102.

In FIG. 7, the etch back process removes the overhang 113 resulting in the structure shown. After the etch back process, the seed layer 112 which lines the opening 102 (and over the barrier layer 108) yields the opening 102 with an entrance or mouth 115 or 117 leading into the opening 102. After the etch back process, the entrance 115 or 117 is generally wider or at least as wide as the opening 102. In one embodiment, the entrance 115 or 117 has as width $W_{101}$ or $W_{103}$ whereas the opening 102 has a width $W_{201}$. In the present embodiment, the width $W_{101}$ and/or $W_{103}$ of the entrance 115 is generally wider or larger than the width $W_{201}$ of the opening 102. In other embodiment, the width $W_{101}$ and/or $W_{103}$ is at least the same as the width $W_{201}$ and not smaller than the width $W_{201}$. Such entrance facilitates uniform deposition or filling of the opening 102 with minimal or no incidence of void formation in the fill material. On the other hand, as can be seen from FIG. 6, the opening entrance into the opening generally has a smaller width than the opening due to the overhang 113 formation.

In one embodiment, the seed layer 112 has a thickness of less than 60 Å, optimally, less than 45 Å, and even less than 20 Å along the sidewalls of the opening 102 (that is lined with the barrier layer 108) and optionally, along all surfaces of the barrier layer 108 that reside within the opening 102. The seed material 112 may be deposited in a chemical vapor deposition (CVD) process, an atomic layer deposition (ALD) process or a physical vapor deposition (PVD) process, such as magnetron sputtering, but is not so limited. In one embodiment, the seed material 112 provides a nucleation site for a subsequent electroless plating process. The seed material 112 may include, but is not limited to, copper (Cu), palladium (Pd), cobalt (Co), nickel (Ni), ruthenium (Ru), platinum (Pt), alloys thereof, and the like. In one embodiment, the solution used to deposit the seed material 112 may comprise palladium chloride or silver chloride (less than about 5 gm/liter), ethylenediamine tetraacetic acid (less than about 3 gm/liter, hydrochloric acid (of a suitable concentration), glacial acetic acid (less than about 100 ml/liter), and the balance de-ionized water.

In one embodiment, the seed layer 112 is etched back to remove at least the overhang 113 using electropolishing. Etch back thus removes some portion, section, or thickness of the seed layer 112 after it is formed. The etch rate is controlled so as to etch the seed layer 112, at least at the overhang section 115 at a rate ranging from 20 Å/second to 70 Å/second, in one embodiment. An optimal etch back rate may be about 20 Å/second. Electropolishing is performed by placing the structure with the seed layer 112 in an electrolyte solution that etches at a non-aggressive rate and that etches the seed layer 112 without damaging other layers or features such as the dielectric layer. A conventional electroplating apparatus can be used for the electropolishing (except with using a reversed current polarity and a different electrolyte designed to remove the material as opposed to plating to form the material). A current density is applied to the electrolyte solution to begin etching the seed layer 112. Current density ranging from 5-5.5 mA/cm$^2$ can be used to apply to the electrolyte solution. In one embodiment, the electrolyte is mixed or made to be relatively viscous, e.g., with a viscosity ranging from 100-300 cP. The viscous electrolyte enables a slow rate etching, controlled etching, and removal of only a thin section or layer sufficiently to remove the overhang 115, or sufficiently to provide a wide entrance 115 into the opening 102. The etch back can occur at a temperature ranging from 15-30° C. In one embodiment, the barrier material layer 108 is made of a conductive material that is sufficiently conductive for the chosen electrolyte solution.

The removed thickness of the overhanging 115 depends on various factors such as the seed layer 112 original thickness, the applied current density, the electrolyte viscosity, and polishing time. Any of these parameters can be controlled to obtain the desired etched back thickness to remove the overhang as shown in FIG. 7. In one embodiment, the electrolyte solution comprises phosphoric acid (about 50%), glycerin (about 39.5%), and water (about 10.5%). The exemplary electrolyte solution has a viscosity of about 220 cP. Any of the components can, of course, be varied to obtain a desired etch rate depending on the seed material layer's original thickness and the material itself.

In one embodiment, the seed layer 112 comprises copper. The electrolyte and the electropolishing process parameters are chosen to be suitable for a slow and controlled etching of copper, e.g., to etch the copper at a rate of about 10-70 Å/sec. The etch back rate for the seed layer 112 and the etching duration are chosen to remove the overhang 113 so that the entrance into the opening is at least as wide or preferably wider than the remaining of opening itself (e.g., as shown in FIG. 7). The entrance into the opening is preferably as wide as possible so that depositing or forming of copper into the opening is optimal and uniform.

In one embodiment, the etch back process is performed by a conventional chemical etching process. A suitable etching solution can be a nitric acid containing solution, an ammonium persulfate containing solution, or any combination thereof. The chemical etching solution can also include a mineral acid (e.g., phosphoric or sulfuric acid), an organic acid (citric or acetic acid), an oxidizer (e.g., hydrogen peroxide) and surfactant (PEG or PPE). The concentration and component concentration of the etching solution can be controlled to provide a desired or suitable etch rate, e.g., of about 10-70 Å/sec. As before, the etch back rate for the seed layer 112 and the etching duration are chosen to remove the overhang 113 so that the entrance into the opening is at least as wide or preferably wider than the remaining of the opening itself (e.g., as shown in FIG. 7). The entrance into the opening is preferably as wide as possible so that depositing or forming of copper into the opening is optimal and uniform.

In one embodiment, the conductive material for the seed layer 112 is copper or copper alloy. The seed layer is deposited to carry the electrical current for the electroplating of the copper. The seed layer can also be formed from nickel, gold, or other materials.

A conductive material layer 114 is next deposited within the opening 102 (see FIG. 8). In one embodiment, a conventional electroplating process is used to fill the opening 102 with the conductive material, e.g., copper. Electroless deposition process can also be used and may include any autocatalytic (e.g., no external power supply is applied) deposition of the conductive material layer 114 through the interaction of a metal salt and a chemical reducing agent. As is known in the art, preparing or treating a surface, may be necessary in order to produce an activated surface so that the surface that is receptive to the electroless deposition process. The electroplating or electroless plating process can be performed using the same tool used for the etch back process. The electrolyte would be different from that used in the etch back process and would be used to plate the material as opposed to etch the material.

In one embodiment, the electroless plating bath or deposition solution may comprise cobalt and alloys thereof (such as cobalt alloyed with tungsten, boron, phosphorus, molybdenum, and/or the like), nickel and alloys thereof (such as nickel alloyed with tungsten, boron, phosphorus, molybdenum, and/or the like), copper, palladium, silver, gold, platinum metals and their selective alloys to fill narrow and high aspect ratio trenches and via holes. It is, of course, understood that the electroless deposition solution may also include additives (such as suppressors, polyethylene glycol, and anti-suppressors, di-sulfide) and complexing agents (such as thiosulfate and peroxodisulfate). Although a few examples of materials that may comprise the electroless deposition solution are described here, the solution may comprise other materials that serve to deposit the conductive material electrolessly. The technique of electrolessly depositing a metal or metal alloy is known to those skilled in the art, and may be performed either by immersing the substrate in an electroless deposition solution, by semi-immersion, or by spraying the electroless deposition solution onto the substrate or target (e.g., the dielectric material layer 104). It is well known to those skilled in the art that the seed material 112 may be subsumed during the electroless deposition process, such that the seed material 112 may become continuous with or blend into the conductive material layer 114.

Figure 9:
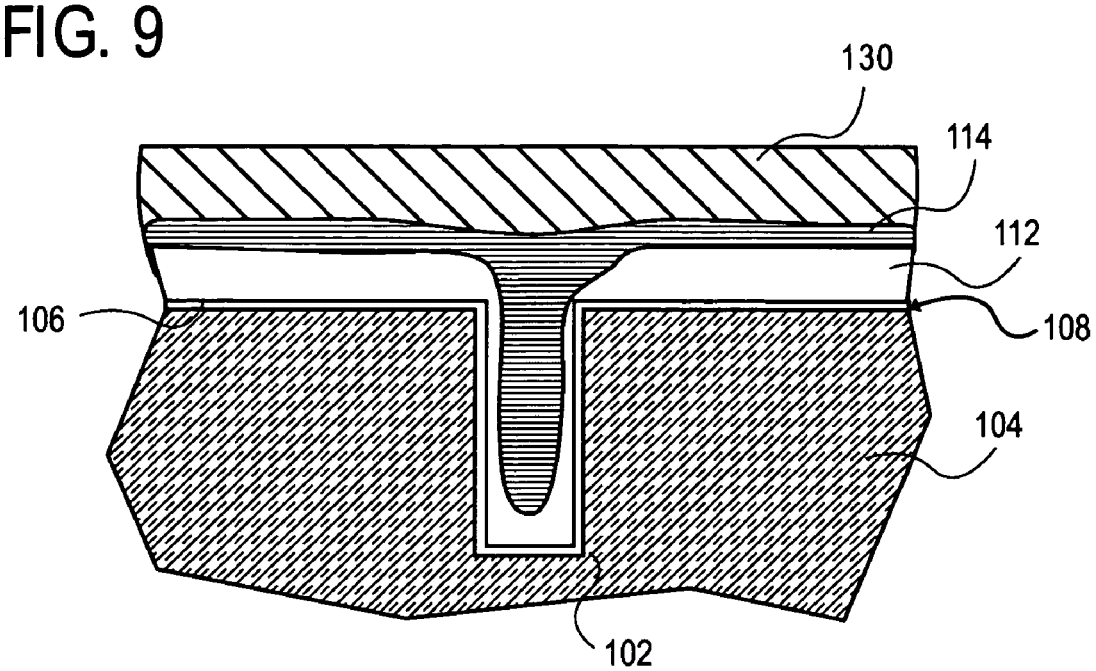
FIG. 9 illustrates a side cross-sectional view of the structure of FIG. 8 having an aluminum film formed over the conductive material.
Figure 10:
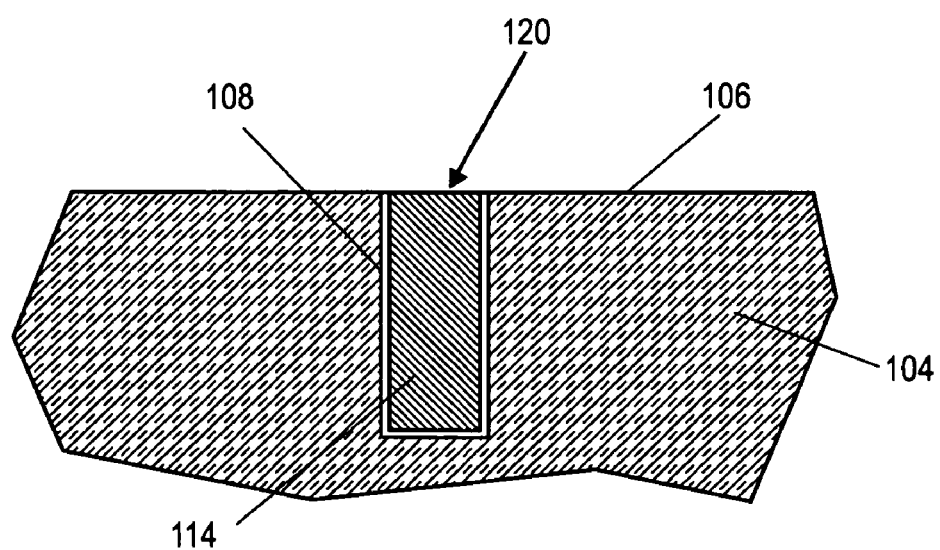
FIG. 10 illustrate a side cross-sectional view of an interconnect being formed after a planarization process performed to the structure shown in FIG. 9 according to the present invention.

The resulting structure 116 of FIG. 8 is planarized to form the structure shown in FIG. 10. In one embodiment, to minimize excessive loss of the conductive material (e.g., copper) and to minimize the mechanical damage of the dielectric layer, especially a low-k dielectric layer 104, an aluminum (Al) layer is blanketly deposited over the conductive material, reflown to form a planar surface, and then polished to planarize. FIG. 9 illustrates an aluminum layer 130 deposited over the conductive material layer 114. Often, the conductive material is not formed with a planar surface as illustrated in FIG. 8, the deposition of the aluminum layer 130 provides the structure with a planar surface. The aluminum layer 130 is then reflown by having the structure being subjected to a thermal treatment process to planarize the electroplated conductive material layer 114. Then, electrochemical polishing or electropolishing is used to remove the aluminum layer 130 together with the conductive material 114 that is not deposited in the opening 102 or that is formed in the field area. The electropolishing thus removes the aluminum and the conductive material from the field area without the potential damages to the mechanical integrity of the dielectric layer. In one embodiment, the electropolishing removes the material with a chemistry that provides a selectivity etch rate of greater than 1:1 for copper: aluminum. In the present embodiment, it is preferred that the copper is etched faster than the aluminum. And, the same electrolyte is used to remove both materials.

As previously mentioned, CMP is commonly used to planarize the conductive material 112 from the field area of the device or the wafer. A major concern of such method is that when the dielectric layer is a low-k dielectric, the CMP process tends to mechanically weaken the dielectric material and the dielectric layer's integrity may be damaged by the stress caused by the conventional CMP (even with pressure less that 2 psi and even with the use of soft pads). Electropolishing alone or even chemical polishing alone may not be sufficient to planarize the conductive material in the presence of a low-k dielectric layer. One reason for that is that electropolishing and chemical polishing have low planarizing ability, especially with respect to a non-flat surface or a non-flat wafer due to the high density of features being formed on the surface. For instance, when copper electroplating is used to fill the features, the final copper surface has a significant topography due to supper fill effects in small structures and conformal fill in larger structures. Electropolishing provides limited planarization resulting in excessive loss of copper in the interconnects or lines of interconnects. Typically, a planar surface is needed to enable electropolishing as shown in FIG. 9. Using electropolishing and chemical polishing for planarization alone tend to cause excessive loss of the conductive material.

In embodiments of the present invention, the copper surface is treated to provide a relatively planar surface. One way to planarize the copper surface is to reflow aluminum that is formed over the copper layer as shown in FIG. 9. In one embodiment, a 1000-3000 Å thick aluminum layer is blanketly deposited over the electroplated copper layer by PVD or CVD. Then, the aluminum is reflowed by heat treating the aluminum in an inert atmosphere (e.g., using helium or nitrogen) or in a reducing atmosphere (e.g., using a hydrogen or forming gas). The reflow temperature can be between about 300-550° C. After that, a planar surface is formed and both the aluminum and copper can be removed from the field area by an electropolishing process or electrochemical dissolution to form an interconnect shown in FIG. 10.

In one embodiment, the electropolishing process is performed by polarizing a metal surface anodically in a phosphoric acid solution similar to previously described for the etch back process. Other suitable electropolishing solutions include a combination of concentrated acids such as phosphoric, sulfuric, and chromic. The electropolishing solution may also include additional additives such as water, glycerin, butanol, ethylene glycol, etc.

It is to be appreciated that other material with the ability to be reflown similar to aluminum can also be used. The reflow-capable material thus formed over a conductive material that is intended for forming the interconnect (e.g., copper or the like). The interconnect material that does not form with a substantially planar surface can benefit from embodiments of the present invention.

Figure 11A:
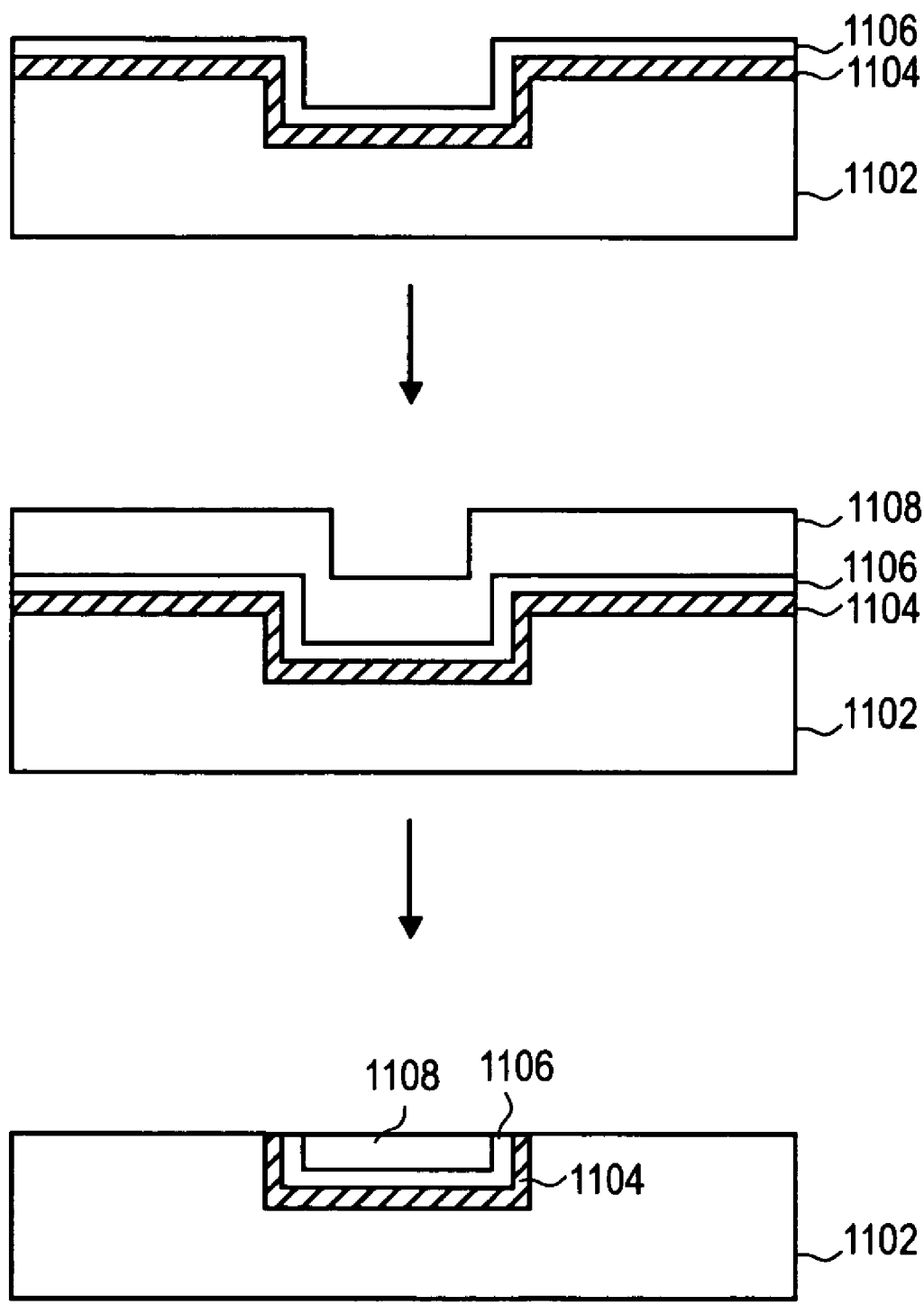

FIGS. 11A and 11B compare some distinctions between the current technologies of planarizing the conductive material with those performed by embodiments of the present invention. In FIG. 11A, as before, a dielectric layer 1102 has an opening formed therein. A barrier layer 1104 is formed to line the opening as previously discussed. A conductive seed layer 1106 is also formed as previously discussed. A conductive material 1108 is deposited by electroplating into the opening. Then, in a conventional method, CMP is used to planarized the conductive material 1108 (and the seed layer 1106 if not already subsumed by the electroplating) and remove the barrier layer 1104 in the field area.

In FIG. 11B, a dielectric layer 1102 has an opening formed therein. A barrier layer 1104 is formed to line the opening as previously discussed. A conductive seed layer 1106 is also formed as previously discussed. A conductive material 1108 is deposited by electroplating into the opening. An aluminum layer 1110 is blanketly deposited over the conductive layer 1108. Then, the structure is subjected to a thermal treatment (e.g., at about 300-550° C.) where the aluminum is reflown to form a planar surface. Electropolishing is then used to remove the aluminum and the conductive material over the field area. The electropolishing rate is preferred to be more selective toward removing the conductive material faster than the aluminum. For example, the electropolishing rate is chosen so that copper is removed faster than the aluminum. Then, to remove the barrier layer 1104 over the field region, a dry etching process using Freon or SF6 based plasma can be used.

Figure 12:
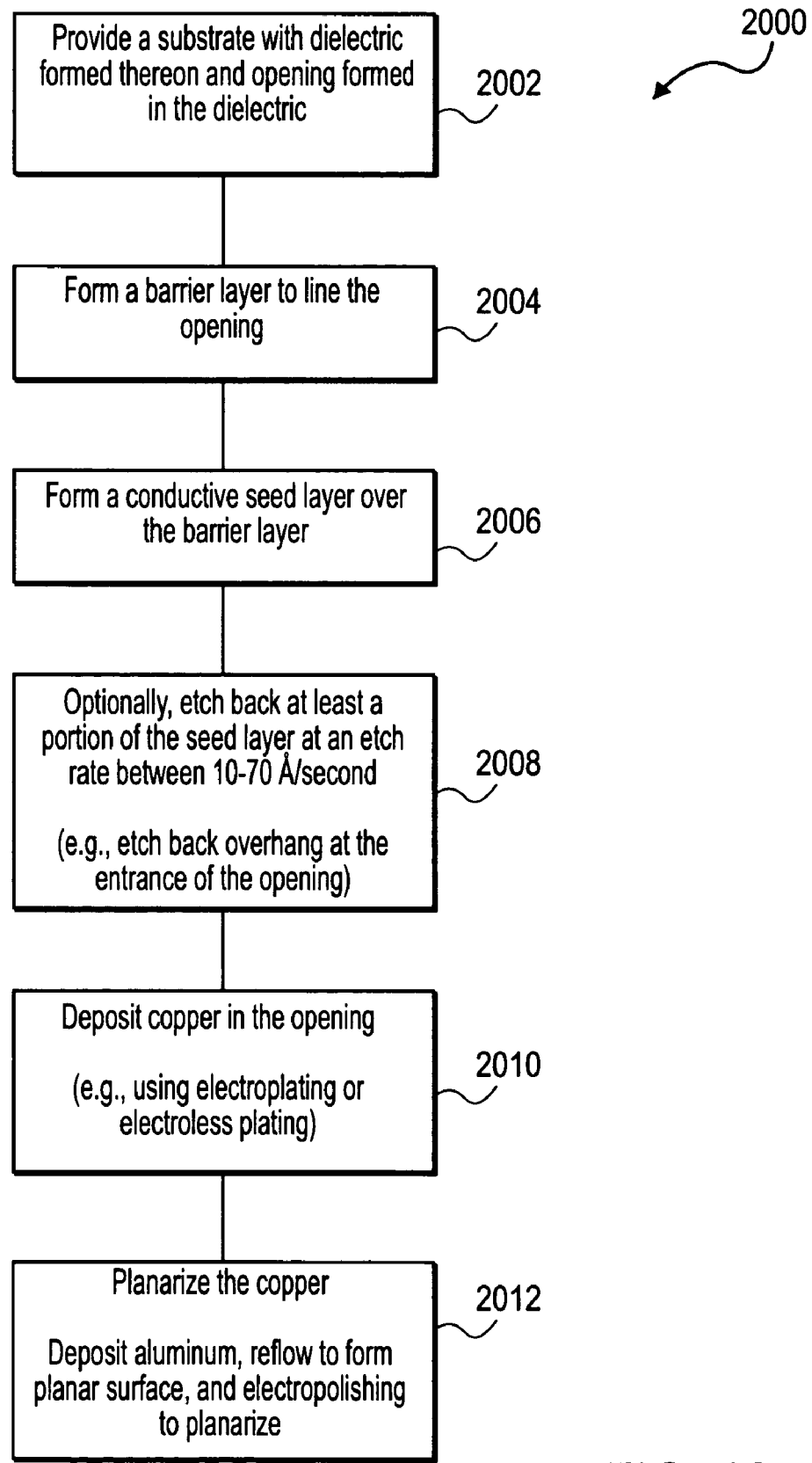
FIG. 12 illustrates an exemplary method of forming an interconnect according to the present invention.

FIG. 12 illustrates an exemplary method 2000 of forming an interconnect (such as the interconnect 120 above or a copper interconnect) in according to embodiments of the present invention. The method 2000 can be readily and easily incorporated into many fabrication processes used to make microelectronic devices. At 2002, a substrate is provided and the substrate has a dielectric layer formed thereon. The dielectric layer can be as previously described and can be a low-k dielectric layer. An opening is also formed in the dielectric using a suitable method, e.g., damascene. At 2004, a barrier layer is formed to line the opening using a conventional method such as CVD or PVD. In some embodiment, the barrier layer also cover a top surface of the dielectric layer or the field area of the device. At 2006, a conductive seed layer (e.g., a copper seed layer) is formed over the barrier layer to line the opening, and optionally, the top surface of the dielectric layer or the field area. The seed layer is formed using a conventional method such as CVD, PVD, or ALD. In one embodiment, as shown at 2008, etch back is performed to remove at least a portion of the seed layer to remove overhang(s) at the entrance of the opening. The etch rate is preferred to be at 20-70 Å/sec. The etch back is performed, in one embodiment, so as to remove the overhang, build up, or to make the entrance into the opening as wide as the opening, or more preferably, wider than the width of the opening. This minimize void formation in the interconnect and facilitate uniform deposition or plating of the conductive material to form the interconnect. In other embodiments, the etch back process is not used especially where the opening is sufficient to allow for a uniform or continuous deposition of the conductive material.

At 2010, a conductive material (e.g., copper) is deposited or plated into the opening. The conductive material can be deposited using electroplating or electroless plating as is known in the art. At 2012, the conductive material is planarized. An aluminum layer is blanketly deposited over the conductive material, e.g., using CVD. The aluminum layer is reflown using a thermal treatment to form a planar surface. Then, electropolishing is then used to remove the conductive material and the aluminum to planarize the surface. The conductive material and the barrier layer not formed in the opening (or formed in the field area) are removed. The barrier layer can be removed using a dry etching process with Freon or other suitable etch methods.

Although the description of the present invention is primarily focused on forming an interconnect with metals and their alloys, the teachings and principles of the present invention are not so limited and can be applied to any material (including plastics), any metal compounds or alloys, to any barrier materials, to nanotech devices, and the like, as will be understood to those skilled in the art. It is also understood that the present invention may be used at any metallization/interconnect layer in the fabrication of a microelectronic device from the transistor level through the packaging process. Embodiments of the present invention enable uniformly filling the small features such as high aspect ratio trenches or vias with dimension less than 50 nm or even less than 32 nm.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming a damascene interconnect layer comprising:
   forming a second conductive film over a non-planar top surface of a first conductive film, the first conductive film disposed in an opening formed in a dielectric layer and further disposed over the dielectric layer in a region adjacent to the opening, said second conductive film having an ability to reflow to planarize a top surface of the second conductive film upon a thermal treatment process; and
   electropolishing to planarize the second and first conductive films, wherein the electropolishing is with an electrolyte solution selective to remove the first conductive film faster than the second conductive film; and
   forming an interconnect.

2. The method of claim 1 further comprising:
   electroplating copper into said opening to form said first conductive film.

3. The method of claim 2 further comprising:
   blanket depositing an aluminum over said electroplated copper, said aluminum forming said second conductive film.

4. The method of claim 1 wherein the thermal treatment occurs at about 300-550° C.

5. The method of claim 1 further comprising:
   forming a copper seed layer to cover the opening and at least a portion of the dielectric layer using one of chemical vapor deposition, physical vapor deposition, and atomic layer deposition, the copper seed layer lining the opening surface and causing an overhang at the opening entrance; and
   electroplating copper to form the first conductive film, and wherein the electropolishing further removes the copper seed layer from over the dielectric layer.

6. The method of claim 5 further comprising:
   forming a barrier layer below the copper seed layer and prior to forming the copper seed layer.

7. The method of claim 6, wherein the electropolishing is selective to the barrler layer and wherein dry etching is used to remove the barrier layer after the electropolishing.

8. The method of claim 6, further comprising:
   blanket depositing an aluminum layer over said electroplated copper, said aluminum forming said second conductive film;
   thermally treating said aluminum layer to reflow said aluminum layer;
   electropolishing with a rate greater than 1:1 copper:aluminum to form the interconnect.

9. The method of claim 6, further comprising:
   etching back the overhang of the copper seed layer prior to depositing the first conductive film, said etching back performed by an electropolishing process with an electrolyte solution having a predetermined viscosity to work in conjunction with a predetermined current density to control the etch rate of the copper seed layer to be at about 10-70 Å/sec.

10. The method of claim 9, wherein the predetermined viscosity ranges from 70-300 cP and the predetermined current ranges from 5-60 mA/cm$^2$.

11. A method of forming a damascene interconnect layer comprising:
providing a dielectric layer having formed therein an opening;
depositing a barrier layer;
depositing a conductive seed layer over the barrier layer;
copper electroplating to fill the opening forming an electroplated copper layer;
blanket depositing an aluminum layer over the electroplated copper layer;
reflowing the aluminum layer using a thermal treatment; and
electropolishing with a chemistry having copper:aluminum selectivity greater than 1:1 to remove aluminum and copper from a field region.

12. The method of claim 11, further comprising:
etching back the conductive seed layer to remove an overhang portion of the copper seed layer such that the opening entrance is wider than or the same width with the remainder of the opening, said etching back is performed by an electropolishing process with an electrolyte solution having a predetermined viscosity to work in conjunction with a predetermined current density to control the etch rate of the copper seed layer to be at about 10-70 Å/sec.

13. The method of claim 12, wherein the predetermined viscosity ranges from 70-300 cP and the predetermined current ranges from 5-60 mA/cm$^2$.

14. A method comprising:
providing a substrate having formed thereon a dielectric layer, an opening is provided in the dielectric layer;
forming a conductive seed layer to line the opening;
etching at least a portion of the conductive seed layer at a controlled etch rate of about 10 Å/sec to about 70 Å/sec; and
depositing an interconnect conductive material into the opening subsequent to the etching of the conductive seed layer, wherein the etched conductive seed layer acts as a nucleation surface for the interconnect conductive material, wherein the interconnect conductive material is deposited to form an interconnect feature and;
blanket depositing an aluminum layer over the conductive material;
reflowing the aluminum layer using a thermal treatment; and
electropolishing with a chemistry having selectivity toward removing the interconnect conductive material at a faster rate than the aluminum.

15. The method of claim 14 wherein the dielectric layer is a low-k dielectric.

16. The method of claim 14 wherein the opening is a small feature with a dimension less than 50 nm.

17. The method of claim 14 farther comprising;
forming a barrier layer below the seed layer and prior to forming the seed layer.

18. The method of claim 14 wherein the seed layer etch removes certain sections of the seed layer such that the entrance of the opening has a width that is larger or at least as wide as the width of the opening.

19. The method of claim 14 wherein the conductive material comprises copper.

20. The method of claim 14 wherein the interconnect feature has no void.

* * * * *

UNITED STATES PATENT AND TRADEMARK OFFICE
CERTIFICATE OF CORRECTION

PATENT NO. : 7,585,760 B2  Page 1 of 1
APPLICATION NO. : 11/473738
DATED : September 8, 2009
INVENTOR(S) : Andryushchenko et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 511 days.

Signed and Sealed this

Fourteenth Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,585,760 B2
APPLICATION NO. : 11/473738
DATED : September 8, 2009
INVENTOR(S) : Andryushchenko et al.

It is certified that error appears in the above-identified patent and that said Letters Patent is hereby corrected as shown below:

In column 12, at line 22 claim 17 delete, "farther" and insert --further--.

Signed and Sealed this

Thirtieth Day of November, 2010

David J. Kappos
*Director of the United States Patent and Trademark Office*

UNITED STATES PATENT AND TRADEMARK OFFICE
CERTIFICATE OF CORRECTION

PATENT NO.       : 7,585,760 B2                                     Page 1 of 1
APPLICATION NO.  : 11/473738
DATED            : September 8, 2009
INVENTOR(S)      : Andryushchenko et al.

It is certified that error appears in the above-identified patent and that said Letters Patent is hereby corrected as shown below:

In column 12, at line 22 claim 17 delete, "farther" and insert --further--.

Signed and Sealed this
Twenty-fifth Day of January, 2011

David J. Kappos
*Director of the United States Patent and Trademark Office*